US011211437B2

(12) United States Patent
Kamiyama

(10) Patent No.: US 11,211,437 B2
(45) Date of Patent: Dec. 28, 2021

(54) METHOD OF MANUFACTURING ORGANIC EL DISPLAY PANEL, ORGANIC EL DISPLAY PANEL, AND ORGANIC EL DISPLAY DEVICE

(71) Applicant: JOLED INC., Tokyo (JP)

(72) Inventor: Isao Kamiyama, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 16/246,727

(22) Filed: Jan. 14, 2019

(65) Prior Publication Data
US 2019/0221623 A1    Jul. 18, 2019

(30) Foreign Application Priority Data

Jan. 15, 2018  (JP) .............................. JP2018-004121

(51) Int. Cl.
*H01L 27/32*  (2006.01)
*H01L 51/56*  (2006.01)
(Continued)

(52) U.S. Cl.
CPC ........ *H01L 27/3246* (2013.01); *H01L 27/322* (2013.01); *H01L 27/3211* (2013.01);
(Continued)

(58) Field of Classification Search
CPC ............. H01L 27/3246; H01L 27/3211; H01L 27/322; H01L 51/56; H01L 51/0021;
(Continued)

(56) References Cited

U.S. PATENT DOCUMENTS 5,126,214 A    6/1992  Tokailin et al.
5,909,081 A    6/1999  Eida et al.
(Continued)

FOREIGN PATENT DOCUMENTS

JP    H3-152897 A    6/1991
JP    H8-279394 A    10/1996
(Continued)

OTHER PUBLICATIONS

Kimura et al., "22.3: New Full Color OLEDs Technology based on Advanced Color Conversion Method using Ink-jet Printing", Fuji Electric Advanced Technology Co., Ltd., 2008, pp. 299-302, SID 08 Digest, Matsumoto, Nagano, Japan, 4pp.
(Continued)

*Primary Examiner* — Patricia D Reddington
(74) *Attorney, Agent, or Firm* — Hauptman Ham, LLP

(57) ABSTRACT

In a method for manufacturing an organic EL display panel including: preparing a substrate; forming pixel electrodes in a matrix of rows and columns; forming banks extending in a column direction at least between the pixel electrodes in a row direction; forming a first light emitting layer by applying an ink including a light emitting material in a first gap selected from a plurality of gaps between the banks; forming a second light emitting layer by a vapor deposition method to be continuous above both the first light emitting layer and the pixel electrodes in a second gap adjacent in the row direction to the first gap; and forming a counter electrode above the second light emitting layer, a height of portions of the banks adjacent to the second gap is made to be greater than a height of portions of the banks adjacent to the first gap.

6 Claims, 10 Drawing Sheets

(51) Int. Cl.
*H01L 51/00* (2006.01)
*H01L 51/50* (2006.01)
*H01L 51/52* (2006.01)

(52) U.S. Cl.
CPC ...... *H01L 51/0005* (2013.01); *H01L 51/0008* (2013.01); *H01L 51/0021* (2013.01); *H01L 51/504* (2013.01); *H01L 51/56* (2013.01); H01L 51/50 (2013.01); H01L 51/52 (2013.01); H01L 51/5209 (2013.01); H01L 51/5218 (2013.01); H01L 51/5234 (2013.01); H01L 51/5253 (2013.01); H01L 2227/323 (2013.01); H01L 2251/5315 (2013.01); H01L 2251/558 (2013.01)

(58) Field of Classification Search
CPC ............. H01L 51/0005; H01L 51/0008; H01L 51/504; H01L 51/5218; H01L 51/5234; H01L 51/5209; H01L 51/525; H01L 2251/558; H01L 2251/5315; H01L 2227/323; H01L 51/5253; H01L 51/52; H01L 51/50
See application file for complete search history.

(56) References Cited

U.S. PATENT DOCUMENTS

| | | |
|---|---|---|
| 2003/0189401 A1 | 10/2003 | Kido et al. |
| 2005/0084775 A1 | 4/2005 | Kawaguchi et al. |
| 2005/0133802 A1 | 6/2005 | Lee et al. |
| 2005/0190253 A1 | 9/2005 | Duineveld et al. |
| 2010/0096988 A1 | 4/2010 | Kitabayashi et al. |
| 2011/0101398 A1 | 5/2011 | Uchida |
| 2012/0049175 A1* | 3/2012 | Ono .................... H01L 27/3246 257/40 |
| 2012/0098414 A1 | 4/2012 | Nakamura |
| 2012/0223633 A1* | 9/2012 | Yoshinaga .......... H01L 51/5056 313/504 |
| 2013/0187132 A1* | 7/2013 | Ando .................. H01L 51/0004 257/40 |
| 2015/0214509 A1 | 7/2015 | Shintani et al. |
| 2016/0293681 A1* | 10/2016 | Shinokawa ......... H01L 27/3246 |
| 2017/0365646 A1* | 12/2017 | Bai ..................... H01L 51/5225 |
| 2018/0323396 A1* | 11/2018 | Tsukamoto ......... H01L 51/5028 |

FOREIGN PATENT DOCUMENTS

| | | |
|---|---|---|
| JP | 2003-272860 A | 9/2003 |
| JP | 2005-135891 A | 5/2005 |
| JP | 2005-516372 A | 6/2005 |
| JP | 201128876 A | 2/2011 |
| JP | 2011119212 A | 6/2011 |
| JP | 2012-38617 A | 2/2012 |
| JP | 2012-186021 A | 9/2012 |
| WO | 03/065474 A1 | 8/2003 |
| WO | 2010/150353 A1 | 12/2010 |
| WO | 2014/049904 A1 | 4/2014 |

OTHER PUBLICATIONS

Zhang et al., "High efficiency tandem organic light-emitting devices with Al/WO3/Au interconnecting layer", Applied Physics Letters 91, Sep. 19, 2007, pp. 123504-1 to 123504-3, American Institute of Physics, 3pp.

Chiba et al., "Ultra-high efficiency by multiple emission from stacked organic light-emitting devices", Organic Electronics, V.12, 2011, available online Feb. 23, 2011, pp. 710-715, V. 12, Elsevier B.V., 6pp.

* cited by examiner

METHOD OF MANUFACTURING ORGANIC EL DISPLAY PANEL, ORGANIC EL DISPLAY PANEL, AND ORGANIC EL DISPLAY DEVICE

This application claims priority to Japanese Patent Application No. 2018-004121, filed Jan. 15, 2018, the contents of which are hereby incorporated by reference in their entirety.

BACKGROUND

Technical Field

The present disclosure relates to methods of manufacturing organic electroluminescence (EL) display panels that include organic EL elements that make use of electroluminescence of organic materials, organic EL display panels, and organic EL display devices that make use of organic EL display panels.

Description of Related Art

In recent years, use of organic EL elements in display devices is becoming widespread.

Organic EL elements have a structure in which at least a light emitting layer is sandwiched between an anode and a cathode. A method by which ink including an organic functional material is applied by a wet process such as inkjet application is known as a method of efficiently forming light emitting layers and functional layers. It is possible to use a smaller manufacturing apparatus in a wet process than in a vacuum deposition method, and it is not necessary to use a shadow mask when depositing functional material. Thus, wet processes are suitable for efficient panel generation, as it is unnecessary to perform work such as alignment of a shadow mask, facilitating manufacture of large substrates for large panels and for improved productivity when manufacturing mixed panel sizes. Further, unlike vapor deposition methods, inkjet methods improve use efficiency of functional material such as expensive light emitting materials, which makes it possible to reduce panel manufacturing costs.

On the other hand, partition walls, also referred to as banks, are required for forming subpixels in order to separately apply ink in which light emitting material or functional material is dissolved, in order to form light emitting layers or functional layers. Mixing, due to ink including functional material overflowing banks, particularly in the case of ink including light emitting material, will cause panel defects when color mixing occurs due to mixing of ink of different colors. Thus, a combined width (also referred to as "bank edge distance") of a subpixel, which is an opening between adjacent banks, and the adjacent banks, is required to be larger than a minimum value according to limitations such as alignment accuracy of heads of inkjet devices and ranges of wet spread of ink, in order that ink to be applied to one subpixel does not enter an adjacent subpixel.

SUMMARY

A method for manufacturing an organic EL display panel reflecting at least one aspect of the present disclosure comprises: preparing a substrate; forming pixel electrodes in a matrix of rows and columns above the substrate; forming banks above the substrate, each of the banks extending in a column direction at least between the pixel electrodes in a row direction; forming a first light emitting layer by applying an ink including a light emitting material in a first gap selected from a plurality of gaps between the banks; forming a second light emitting layer by a vapor deposition method to be continuous above both the first light emitting layer and the pixel electrodes in a second gap adjacent in the row direction to the first gap; and forming a counter electrode above the second light emitting layer. In the forming of the banks, a height of portions of the banks adjacent to the second gap is made to be greater than a height of portions of the banks adjacent to the first gap.

BRIEF DESCRIPTION OF THE DRAWINGS

These and other objects, advantages, and features of the technology pertaining to the present disclosure will become apparent from the following description thereof taken in conjunction with the accompanying drawings, which illustrate at least one embodiment of the technology pertaining to the present disclosure.

FIG. 4A illustrates a state in which a thin-film transistor (TFT) layer is formed on a substrate, FIG. 4B illustrates a state in which an interlayer insulating layer is formed on the substrate, FIG. 4C illustrates a state in which pixel electrode material is formed on the interlayer insulating layer, and FIG. 4D illustrates a state in which pixel electrodes are formed.

FIG. 5A illustrates a state in which a first bank material layer is formed on the interlayer insulating layer and the pixel electrodes, FIG. 5B illustrates a state in which banks 14b and lower portions 142 of banks 14a are formed, FIG. 5C illustrates a state in which a second bank material layer is formed on the interlayer insulating layer, the pixel electrodes, the lower portions 142 of the banks 14a, and the banks 14b, and FIG. 5D illustrates a state in which upper portions 141 of the banks 14a are formed.

FIG. 6A illustrates a state in which hole injection layers are formed on pixel electrodes in apertures 14R, 14G, FIG. 6B illustrates a state in which hole transport layers are formed the hole injection layers in the apertures 14R, 14G, FIG. 6C illustrates a state in which first light emitting layers are formed on the hole transport layer in the apertures 14R, and FIG. 6D illustrates a state in which first light emitting layers are formed on the hole transport layers in the apertures 14G.

FIG. 7A illustrates a state in which a continuous layer is formed on the first light emitting layers, the pixel electrodes in apertures 14B, and the banks, FIG. 7B illustrates a state in which a second light emitting layer is formed on the continuous layer, and FIG. 7C illustrates a state in which an electron injection layer is formed on the second light emitting layer.

FIG. 8A illustrates a state in which a counter electrode is formed on the electron injection layer, and FIG. 8B illustrates a state in which a sealing layer is formed on the counter electrode.

DETAILED DESCRIPTION

<Developments Leading to an Aspect of the Present Disclosure>

When light emitting layers and/or functional layers of an organic EL display panel are formed by an application method, it is necessary to design spacing of banks according to positional accuracy of heads of an inkjet device and wet spreading range of ink.

Figure 2A:
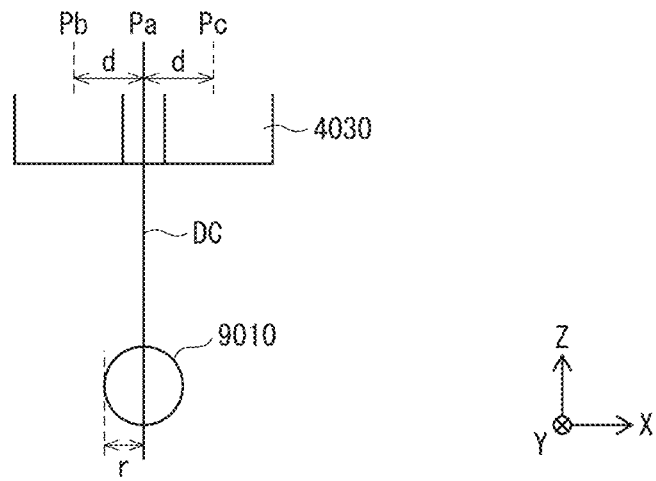
FIG. 2A, FIG. 2B, and FIG. 2C are schematic diagrams illustrating a relationship between inkjet device accuracy and organic EL display panel bank arrangement.
Figure 2B:
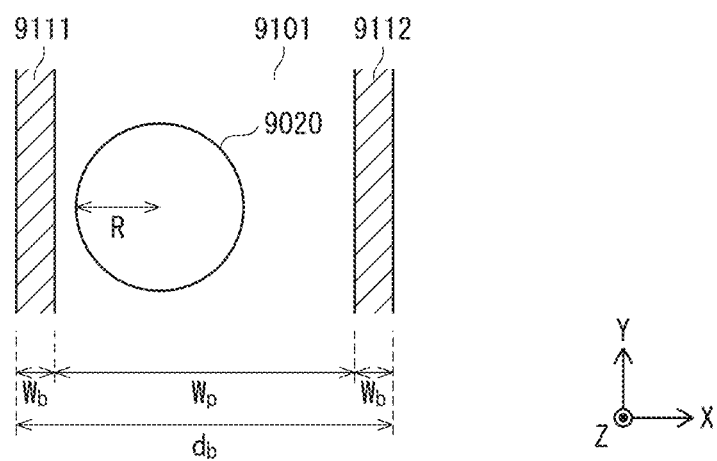
Figure 2C:
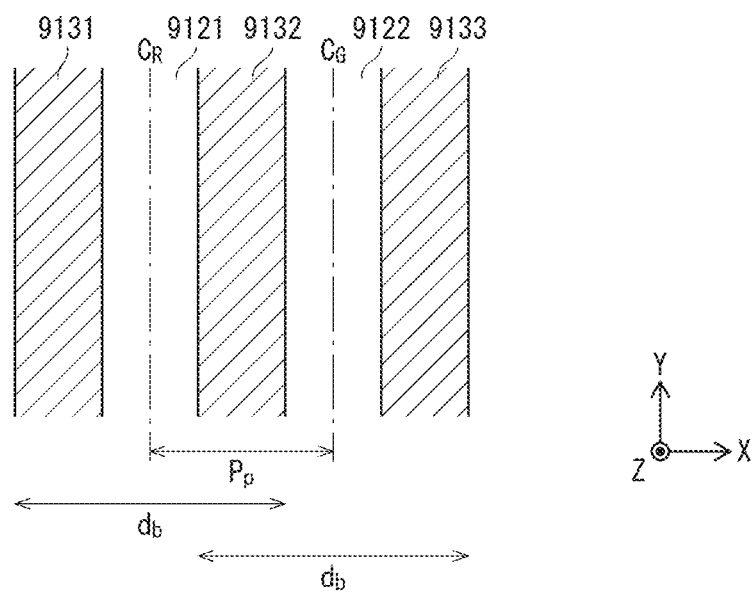

FIG. 2A, FIG. 2B, and FIG. 2C are schematic diagrams for describing a relationship between inkjet device accuracy and width of banks and subpixels. As illustrated in FIG. 2A, a situation is supposed in which ink 9010 is dropped from an inkjet head 4030. Here, when a position set as a trajectory DC of a center of the ink 9010 is Pa, and a maximum deviation between application position as set in the inkjet head 4030 and actual application position is d, an actual trajectory DC of the center of the ink 9010 is any position between position Pb and position Pc, which are in a range of distance d from the position Pa. Deviation from the application position set in the inkjet head 4030 occurs, for example, due to mistiming of ejection of the ink 9010 when applying the ink 9010 while the inkjet head 4030 is scanning in the x direction. Accordingly, as illustrated in FIG. 2B, when a spreading range (radius) of ink 9020 after landing is R, a range along the x axis in which the ink 9020 after landing can be present is a range from a position of distance R left (negative x direction) of the position Pb to a position of distance R right (positive x direction) of the position Pc, i.e. a range equal to or less than a distance (d+R) from DC. Ink after landing that is present in a subpixel adjacent to the subpixel that is the application target causes color mixing and the like, and therefore a range in which ink after landing can be present must be in the subpixel that is the application target and/or on the banks adjacent to the subpixel. Accordingly, when a width in the x direction of a subpixel 9101 is $W_p$ and width of each of two banks 9111, 9112 defining the subpixel 9101 is $W_b$, a bank edge distance $d_b$ must satisfy the following relationship.

$$d_b = W_p + 2W_b \geq 2(d+R) \quad \text{Expression (1)}$$

As illustrated in FIG. 2C, subpixels are arranged in the x direction. In this case, a bank gap 9121 in which a plurality of same-color subpixels are arranged is defined by a bank 9131 and a bank 9132, and similarly, a bank gap 9122 in which a plurality of same-color subpixels are arranged is defined by the bank 9132 and a bank 9133. Here, an inter-pixel distance $P_p$ defined as a distance between a designed application center $C_R$ in the bank gap 9121 and a designed application center $C_G$ in the bank gap 9122 satisfies the following relationship.

$$P_p = 2 \cdot (1/2)W_p + W_b = W_p + W_b \quad \text{Expression (2)}$$

Here, from Expression (1) and Expression (2), the following relationships are established.

$$P_p = (W_p + 2W_b) - W_b = d_b - W_b$$

$$P_p \geq 2(d+R) - W_b \quad \text{Expression (3)}$$

From Expression (3), the following can be said. Although the inter-pixel distance $P_p$ becomes smaller as light emitting panel definition becomes higher, when the maximum deviation d, which is a limitation of the inkjet device, and the ink radius R after landing do not change, the risk of color mixing during application increases unless the bank width $W_b$ is designed to be larger. That is, if an attempt is made to improve definition of a light emitting panel without changing the inkjet apparatus, the risk of mixing of ink (color mixing, etc.) between subpixels increases unless bank width is designed to be large. Accordingly, if an attempt is made to improve definition of a light emitting panel without changing the inkjet apparatus and without increasing the risk of color mixing, a ratio of area of the light emitting panel to area of banks must be decreased, or in other words it is necessary to decrease aperture ratio as a trade-off for increased definition.

Thus, the inventor studied structure of organic EL display panels and obtained knowledge that aperture ratio can be improved according to the manufacturing method pertaining to at least one aspect of the present disclosure.

<<Aspects of Disclosure>>

A method for manufacturing an organic EL display panel reflecting at least one aspect of the present disclosure comprises: preparing a substrate; forming pixel electrodes in a matrix of rows and columns above the substrate; forming banks above the substrate, each of the banks extending in a column direction at least between the pixel electrodes in a row direction; forming a first light emitting layer by applying an ink including a light emitting material in a first gap selected from a plurality of gaps between the banks; forming a second light emitting layer by a vapor deposition method to be continuous above both the first light emitting layer and the pixel electrodes in a second gap adjacent in the row direction to the first gap; and forming a counter electrode above the second light emitting layer. In the forming of the banks, a height of portions of the banks adjacent to the second gap is made to be greater than a height of portions of the banks adjacent to the first gap.

According to the manufacturing method pertaining to at least one aspect of the present disclosure, in a manufactured organic EL display panel, a surface area of the first light emitting layer formed in the first gap and a portion of the second light emitting layer in the second gap both help make limitations of an inkjet device less restrictive. Accordingly, it is possible to achieve an improvement in both definition and aperture ratio of the organic EL display panel.

Further, an organic EL display panel pertaining to at least one aspect of the present disclosure comprises: a substrate; pixel electrodes arranged in a matrix of rows and columns above the substrate; banks disposed above the substrate, each of the banks extending in a column direction between the pixel electrodes in a row direction; a first light emitting layer disposed above the pixel electrodes in a first gap selected from a plurality of gaps between the banks; a second light emitting layer that is continuous above both the first light emitting layer and the pixel electrodes in a second gap adjacent in the row direction to the first gap; and a counter electrode disposed above the second light emitting layer, wherein a height of portions of the banks adjacent to the second gap is greater than a height of portions of the banks adjacent to the first gap.

The organic EL display panel pertaining to at least one aspect of the present disclosure achieves the same effects as the manufacturing method pertaining to at least one aspect of the present disclosure.

Further, an organic EL display device pertaining to at least one aspect of the present disclosure is an organic EL display device including the organic EL display panel.

The organic EL display device achieves the same effects as the manufacturing method pertaining to at least one aspect of the present disclosure.

The manufacturing method may be configured as follows.

A third light emitting layer may be formed prior to the forming of the second light emitting layer by applying ink including a light emitting material to a third gap adjacent to the second gap in the row direction, and the second light emitting layer may be formed to also be continuous above the third light emitting layer.

Accordingly, definition can be improved in an organic EL display device that includes three or more colors of organic EL element.

The light emitting material of the ink of the first light emitting layer may emit red light, the light emitting material of the ink of the third light emitting layer may emit green light, and the second light emitting layer may be formed by using a light emitting material that emits blue light.

Accordingly, a decrease in red and green light emission intensity can be suppressed.

Further, in the forming of the banks, a width of banks adjacent to both the first gap and the third gap may be made greater than a width of banks adjacent to the second gap.

Accordingly, narrowing of the second gap can be prevented while maintaining width of banks between the first gap and the second gap in order to prevent color mixing.

Further, in the forming of the banks, a height of banks adjacent to both the first gap and the third gap may be made the same as a height of a portion adjacent to the first gap of banks adjacent to the second gap.

Accordingly, manufacturing of the banks can be simplified while preventing the banks between the first gap and the third gap from becoming excessively high.

Further, a width in the row direction of the second gap may be made less than a width in the row direction of the first gap.

Accordingly, a surface area of the first light emitting layer, which is difficult to increase, can be increased, which can improve the aperture ratio.

Further, a first functional layer may be formed in the first gap by an application method prior to the forming of the first light emitting layer, wherein the first functional layer is not formed on the pixel electrodes in the second gap.

Accordingly, light emission efficiency of the first light emitting layer can be improved while avoiding influencing shapes of the banks on either side of the second gap.

Further, a second functional layer may be formed on the first light emitting layer and the pixel electrodes in the second gap by a vapor deposition method prior to the forming of the second light emitting layer.

Accordingly, light emission efficiency of the second light emitting layer in the second gap can be improved while ensuring function of the first light emitting layer and the second light emitting layer in the first gap.

The organic EL display panel and the organic EL display device may be structured as follows.

A third light emitting layer may be disposed above the pixel electrodes in a third gap adjacent in the row direction to the second gap, and the second light emitting layer may also be continuous above the third light emitting layer.

Accordingly, definition can be improved in an organic EL display device that includes three or more colors of organic EL element.

The first light emitting layer may include a light emitting material that emits red light, the third light emitting layer may include a light emitting material that emits green light, and the second light emitting layer may include a light emitting material that emits blue light.

Accordingly, a decrease in red and green light emission intensity can be suppressed.

A width of the banks adjacent to both the first gap and the third gap may be greater than a width of the banks adjacent to the second gap.

Accordingly, narrowing of the second gap can be prevented while maintaining width of banks between the first gap and the second gap in order to prevent color mixing.

A height of the banks adjacent to both the first gap and the third gap may be the same as a height of a portion adjacent to the first gap of the banks adjacent to the second gap.

Accordingly, manufacturing of the banks can be simplified while preventing the banks between the first gap and the third gap from becoming excessively high.

A width in the row direction of the second gap may be less than a width in the row direction of the first gap.

Accordingly, a surface area of the first light emitting layer, which is difficult to increase, can be increased, which can improve the aperture ratio.

A first functional layer may be disposed between the first light emitting layer and the pixel electrodes in the first gap, and not between the second light emitting layer and the pixel electrodes in the second gap.

Accordingly, light emission efficiency of the first light emitting layer can be improved while avoiding influencing shapes of the banks on either side of the second gap.

A second functional layer may be disposed between the second light emitting layer and the first light emitting layer and between the second light emitting layer and the pixel electrodes in the second gap.

Accordingly, light emission efficiency of the second light emitting layer in the second gap can be improved while ensuring function of the first light emitting layer and the second light emitting layer in the first gap.

Further, a method for manufacturing an organic EL display panel pertaining to at least one aspect of the present disclosure is a method comprising: preparing a substrate; forming pixel electrodes in a matrix of rows and columns above the substrate; forming banks above the substrate, each of the banks extending in a column direction between the pixel electrodes in a row direction; forming a second light emitting layer by a vapor deposition method in a first gap selected from a plurality of gaps between the banks and in a second gap adjacent to the first gap in the row direction; forming a first light emitting layer by applying an ink including a light emitting material above the second light emitting layer and the pixel electrodes in the first gap; and forming a counter electrode above the first light emitting layer and the second light emitting layer, wherein in the forming of the banks, a height of portions of the banks adjacent to the second gap is made to be greater than a height of portions of the banks adjacent to the first gap.

Further, an organic EL display panel pertaining to at least one aspect of the present disclosure is an organic EL display panel comprising: a substrate; pixel electrodes arranged in a matrix of rows and columns above the substrate; banks disposed above the substrate, each of the banks extending in a column direction between the pixel electrodes in a row direction; a second light emitting layer disposed above the pixel electrodes in a first gap selected from a plurality of gaps between the banks and in a second gap adjacent to the first gap in the row direction; a first light emitting layer disposed above the pixel electrodes in the first gap, above the second light emitting layer, and a counter electrode disposed above the first light emitting layer and the second light emitting layer, wherein a height of portions of the banks adjacent to the second gap is greater than a height of portions of the banks adjacent to the first gap.

Said manufacturing method and said organic EL display panel also achieve the effects described above.

Embodiments

The following describes an organic EL display panel pertaining to at least one embodiment. The following description is illustrative, for the purpose of explaining structure, operation, and effects pertaining to an aspect of the present disclosure, and the present disclosure is not limited to the following description, except for description of essential features.

1. Structure of Organic EL Display Panel and Organic EL Elements

Figure 1:
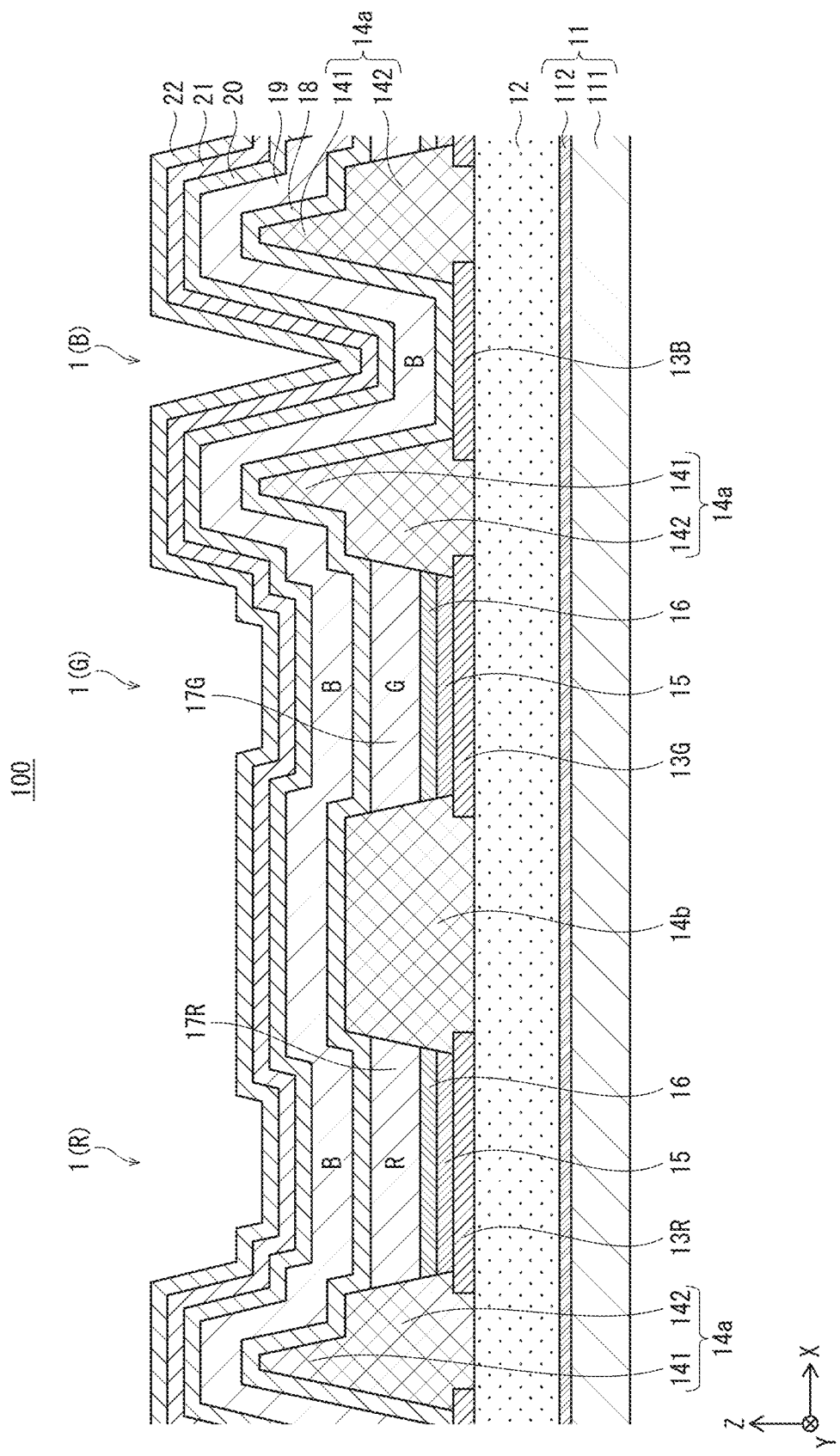
FIG. 1 is a cross section diagram schematically illustrating structure of an organic EL display panel 100 pertaining to at least one embodiment.
Figure 10:
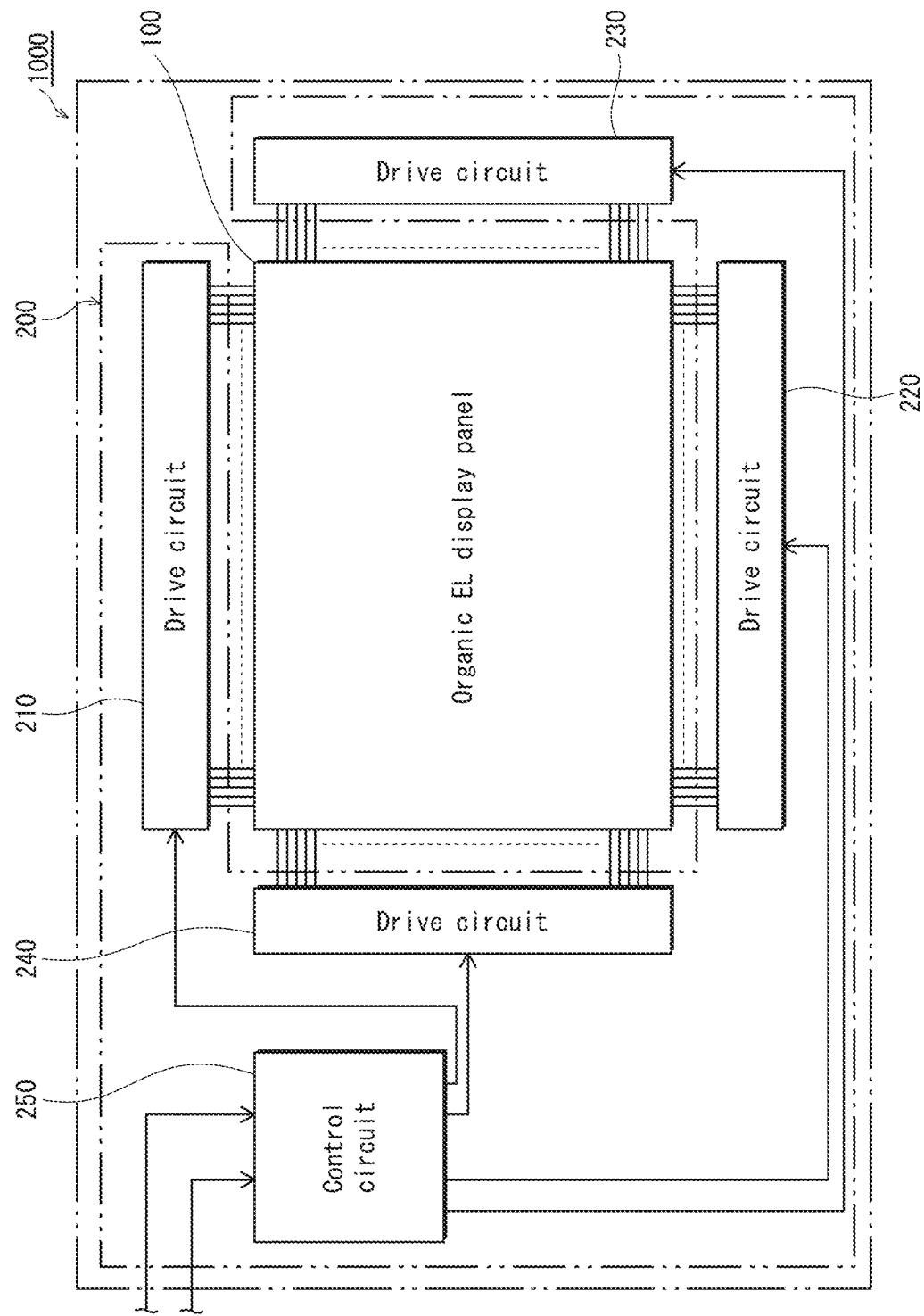
FIG. 10 is a block diagram illustrating an overall configuration of an organic EL display device pertaining to at least one embodiment.

FIG. 1 is a cross section diagram of a portion of an organic EL display panel 100 (see FIG. 10) pertaining to Embodiment 1. The organic EL display panel 100 includes pixels, each pixel including organic EL elements 1(R), 1(G), 1(B) that emit red light, green light, and blue light, respectively. In FIG. 1, a cross section of one such pixel is illustrated.

In the organic EL display panel 100, each organic EL element 1 is a top-emission type that emits light in a forwards direction (away from the substrate).

The organic EL element 1(R) and the organic EL element 1(G) have substantially the same structure, and therefore are described as the organic EL element 1(R/G) unless a distinction is made. Further, portions of the organic EL element 1(R/G) and the organic EL element 1(B) that have similar structure may be described the organic EL element 1 where a distinction is not made.

As illustrated in FIG. 1, the organic EL element 1(R/G) includes a substrate 11, an interlayer insulating layer 12, a pixel electrode 13R or 13G banks 14, a hole injection layer 15, a hole transport layer 16, a first light emitting layer 17, a connecting layer 18, a second light emitting layer 19, an electron injection layer 20, a counter electrode 21, and a sealing layer 22. The organic EL element 1(B) does not include the hole injection layer 15, the hole transport layer 16, or the first light emitting layer 17, but includes the substrate 11, the interlayer insulating layer 12, a pixel electrode 13B, the banks 14, the connecting layer 18, the second light emitting layer 19, the electron injection layer 20, the counter electrode 21, and the sealing layer 22.

The substrate 11, the interlayer insulating layer 12, the connecting layer 18, the second light emitting layer 19, the electron injection layer 20, the counter electrode 21, and the sealing layer 22 are not formed discretely for each pixel, but are formed to be common to a plurality of the organic EL elements 1 of the organic EL display panel 100.

<Substrate>

The substrate 11 includes a base 111, which is an insulating material, and a thin film transistor (TFT) layer 112. In the TFT layer 112 is formed a drive circuit per pixel. The base 111 is, for example, a glass substrate, a quartz substrate, a silicon substrate, a metal substrate such as molybdenum sulfide, copper, zinc, aluminum, stainless steel, magnesium, iron, nickel, gold, or silver, a semiconductor substrate such as gallium arsenide, a plastic substrate, or the like. As a plastic material, a thermoplastic resin or a thermosetting resin may be used. For example, polyethylene, polypropylene, polyamide, polyimide (PI), polycarbonate, acrylic resin, polyethylene terephthalate (PET), polybutylene terephthalate, polyacetal, a fluoride resin, a thermoplastic elastomer such as styrene, polyolefin, polyvinyl chloride, polyurethane, fluorine rubber, or chlorinated polyethylene, epoxy resin, unsaturated polyester, silicone resin, polyurethane, or the like, or a copolymer, a blend, or polymer alloy mainly comprising said material, or a laminate comprising one or more of said materials can be used.

<Interlayer Insulating Layer>

The interlayer insulating layer 12 is formed on the substrate 11. The interlayer insulating layer 12 is made of a resin material, and is for planarizing an uneven top surface of the TFT layer 112. As a resin material, a positive type of photosensitive material is an example. Further, as the photosensitive material, acrylic resin, polyimide resin, siloxane resin, and phenolic resin are examples. Further, although not illustrated in FIG. 1, a contact hole per pixel is formed in the interlayer insulating layer 12.

<Pixel Electrodes>

The pixel electrodes 13R, 13Q 13B include a metal layer made of a light-reflective metal material, and are formed on the interlayer insulating layer 12. One of the pixel electrodes 13R, 13G 13B is provided per subpixel, and the pixel electrodes 13R, 13G 13B are electrically connected to the TFT layer 112 via contact holes.

According to the present embodiment, the pixel electrodes 13R, 13G 13B function as anodes.

Specific examples of light-reflective metal material are silver (Ag), aluminum (Al), aluminum alloy, molybdenum (Mo), silver palladium copper alloy (APC), silver rubidium gold alloy (ARA), molybdenum and chromium alloy (MoCr), molybdenum and tungsten alloy (MoW), nickel and chromium alloy (NiCr), and the like.

The pixel electrodes 13R, 13G, 13B may each be a single metal layer, and may each be a laminate structure with a layer made of a metal oxide such as indium tin oxide (ITO) or indium zinc oxide (IZO) on a metal layer.

Although the pixel electrodes 13R and the pixel electrodes 13G have similar structures, the pixel electrodes 13B have a smaller width in the x direction than the pixel electrodes 13R and the pixel electrodes 13G. Further, it is advantageous that surface area of the pixel electrodes 13B be substantially the same as surface area of the pixel electrodes 13R and surface area of the pixel electrodes 13Q and therefore the pixel electrodes 13B have a greater length in the y direction than the pixel electrodes 13R and the pixel electrodes 13G. The second light emitting layer 19 is formed by vapor deposition, as described later, and therefore film thickness of the second light emitting layer 19, which is the light emitting layer of the organic EL elements 1(B), is uniformly greater than film thickness of the first light emitting layers, which are the light emitting layers of the organic EL elements 1(R/G), and boundary regions between organic EL elements 1(B) that are adjacent in the y direction can be made smaller.

<Banks>

The banks 14 are formed on the pixel electrodes 13 so as to expose a portion of each top surface of the pixel electrodes 13 and cover regions on both sides of the portions in the x direction. The portion of each top surface of the pixel electrodes 13 not covered by the banks 14 in the x direction (also referred to as an "aperture") corresponds to a subpixel. That is, in the x direction, the banks 14 define an aperture per subpixel.

According to the present embodiment, the banks 14 are formed on the interlayer insulating layer 12 where the pixel electrodes 13 are not present. That is, where the pixel electrodes 13 are not present, bottom surfaces of the banks 14 are in contact with a top surface of the interlayer insulating layer 12.

The banks 14 are, for example, made of an insulative organic material. The banks 14 function as a structure for preventing overflow of ink applied when forming the hole injection layers 15, the hole transport layers 16, and the first light emitting layers 17. According to the present embodiment, the banks 14 are made of a resin material, examples of which include acrylic resin, polyimide resin, siloxane resin, and phenolic resin. According to the present embodiment, phenolic resin is used.

The banks 14 are classified into first banks 14a and second banks 14b. The first banks 14a are provided between the organic EL elements 1(B) and the organic EL elements 1(R/G), and portions of the first banks 14a adjacent to the organic EL elements 1(B) are taller than portions of the first banks 14a adjacent to the organic EL elements 1(R/G). More specifically, each of the first banks 14a is made of a lower portion 142 that has a shape in cross section that is substantially an acute trapezoid and an upper portion 141 that is narrower in the x direction than the lower portion 142, and the upper portions 141 are formed on top surfaces of the lower portions 142 that are adjacent to the organic EL elements 1(B). It is advantageous that side surfaces of the lower portions 142 adjacent to the organic EL elements 1(B) are substantially continuous with side surface of the upper portions 141 adjacent to the organic EL elements 1(B), and portions of the top surfaces of the lower portions 142 adjacent to the organic EL elements 1(R/G) are exposed so as to form a step shape. The second banks 14b are provided between the organic EL elements 1(R) and the organic EL elements 1(G). The second banks 14b each have a shape in cross section that is substantially an acute trapezoid, and while heights thereof are substantially the same as heights of the lower portions 142, width in the x direction of the second banks 14b is greater than that of the lower portions 142.

<Third Banks>

Although not illustrated, third banks are formed between organic EL elements 1(B) that are adjacent to each other in the y direction, and between organic EL elements 1(R/G) that are adjacent to each other in the y direction. The third banks are provided between the pixel electrodes 13R, 13G, 13B in the y direction and cover ends of the pixel electrodes 13R, 13G 13B in the y direction. The third banks are provided below the first banks 14a and the second banks 14b, and top surfaces of the third banks have lyophilicity with respect to ink applied thereon.

<Hole Injection Layers>

The hole injection layers 15 are provided on the pixel electrodes 13R, 13G of the organic EL elements 1(R/G) for promoting injection of holes from the pixel electrodes 13 to the first light emitting layer 17 and are continuous between the organic EL elements 1(R/G) that are adjacent to each other in the y direction, spanning across the third banks.

Specific examples of material of the hole injection layers 15 include electrically conductive polymers such as poly(3,4-ethylenedioxythiophene) polystyrene sulfonate (PEDOT: PSS).

The hole injection layers 15 may be made of a transition metal oxide. Specific examples of transition metals include silver (Ag), molybdenum (Mo), chromium (Cr), vanadium (V), tungsten (W), nickel (Ni), and iridium (Ir). Transition metals take a plurality of valences, and therefore a plurality of levels, and as a result, hole injection becomes easier and this contributes to a reduction in drive voltage. Here, the hole injection layers 15 advantageously have a large work function.

<Hole Transport Layers>

The hole transport layers 16 are formed on the hole injection layers 15 in apertures corresponding to the organic EL elements 1(R/G). A material of the hole transport layers 16 is a polymer compound having no hydrophilic group, specific examples of which include polyfluorene, derivatives thereof, and polyarylamine, and derivatives thereof.

The hole transport layers 16 have a function of transporting holes injected from the hole injection layers 15 to the first light emitting layers 17.

<First Light Emitting Layers>

The first light emitting layers 17 are formed on the hole transport layers 16 in apertures corresponding to the organic EL elements 1(R/G). The first light emitting layers 17 have a function of emitting red, green colors of light, according to recombination of holes and electrons. A material of the first light emitting layers 17 can be a known material. Examples include fluorescent substances such as oxinoid compounds, perylene compounds, coumarin compounds, azacoumarin compounds, oxazole compounds, oxadiazole compounds, perinone compounds, pyrrolopyrrole compounds, naphthalene compounds, anthracene compounds, fluorene compounds, fluoranthene compounds, tetracene compounds, pyrene compounds, coronene compounds, quinolone compounds, azaquinolone compounds, pyrazoline derivatives, pyrazolone derivatives, rhodamine compounds, chrysene compounds, phenanthrene compounds, cyclopentadiene compounds, stilbene compounds, diphenylquinone compounds, styryl compounds, butadiene compounds, dicyanomethylene pyran compounds, dicyanomethylene thiopyran compounds, fluorescein compounds, pyrylium compounds, thiapyrylium compounds, selenapyrylium compounds, telluropyrylium compounds, aromatic aldadiene compounds, oligophenylene compounds, thioxanthene compounds, cyanine compounds, acridine compounds, metal complexes of 8-hydroxyquinoline compounds, metal complexes of 2-bipyridine compounds, complexes of a Schiff salt and a group III metal, oxine metal complexes, and rare earth complexes.

<Connecting Layer>

The connecting layer 18 is formed across the apertures and the banks 14, and is a layer common to the organic EL elements 1. In the organic EL elements 1(B), the connecting layer 18 has a function of promoting injection of holes from the pixel electrodes 13 to the second light emitting layer 19, and in the organic EL elements 1(R/G), the connecting layer 18 has a function of confining triplet excitons formed in the first light emitting layers 17 in the first light emitting layers 17. Thickness of the connecting layer 18 is advantageously from 1 nm to 30 nm, and according to at least one embodiment is from 1 nm to 15 nm.

A material of the connecting layer 18 advantageously satisfies the following conditions. First, in order to confine triplet excitons formed in the first light emitting layers 17 to the first light emitting layers 17, a triplet excited state of the connecting layer 18 is advantageously at least 0.1 eV higher than a triplet excited state of the first light emitting layers 17. Second, in order to promote the injection of holes to the second light emitting layer 19, in addition to have a hole transport property, a difference in energy of a ground state of the second light emitting layer 19 and energy of a ground state of the connecting layer 18 is advantageously 0.4 eV or less. Third, the connecting layer 18 is formed by vapor deposition, and is therefore advantageously a low molecular weight material, and in particular a monomer. Specific examples include a phosphorescent host material; or benzene, styrylamine, triphenylamine, porphyrin, triphenylene, azatriphenylene, tetracyanoquinodimethane, triazole, imidazole, oxadiazole, polyarylalkane, phenylenediamine, arylamine, oxazole, anthracene, fluorenone, hydrazone, stilbene, or a derivative thereof; or a heterocyclic conjugated monomer or oligomer such as a vinyl carbazole compound, a thiophene compound, or an aniline compound. More specific examples include porphyrin, metal tetraphenylporphyrin, metal naphthalocyanine, N,N,N',N'-tetrakis(p-tolyl) p-phenylenediamine, N,N,N',N'-tetraphenyl-4,4'-diaminobiphenyl, N-phenylcarbazole, and 4-di-p-tolylaminostilbene.

<Second Light Emitting Layer>

The second light emitting layer 19 is formed on the connecting layer 18 and is a layer common to the organic EL elements 1. In the organic EL elements 1(B), the second light emitting layer 19 functions as a light emitting layer emitting blue light due to recombination of holes and electrons, and in the organic EL elements 1(R/G), the second light emitting layer 19 functions as a recombination region exciting light emitting material of the first light emitting layers 17 due to recombination of holes and electrons. That is, in the organic EL elements 1(B), the second light emitting layer 19 emits light as a light emitting layer, but in the organic EL elements 1(R) and the organic EL elements 1(G), only the first light emitting layers 17 functions as light emitting layers, and the second light emitting layer 19 does not emit light. Accordingly, wavelength of light emitted by the second light emitting layer 19 is advantageously shorter than wavelength of light emitted by the first light emitting layers 17. A material of the second light emitting layer 19 can be a known material. Examples include fluorescent substances such as oxinoid compounds, perylene compounds, coumarin compounds, azacoumarin compounds, oxazole compounds, oxadiazole compounds, perinone compounds, pyrrolopyrrole compounds, naphthalene compounds, anthracene compounds, fluorene compounds, fluoranthene compounds, tetracene compounds, pyrene compounds, coronene compounds, quinolone compounds, azaquinolone compounds, pyrazoline derivatives, pyrazolone derivatives, rhodamine compounds, chrysene compounds, phenanthrene compounds, cyclopentadiene compounds, stilbene compounds, diphenylquinone compounds, styryl compounds, butadiene compounds, dicyanomethylene pyran compounds, dicyanomethylene thiopyran compounds, fluorescein compounds, pyrylium compounds, thiapyrylium compounds, selenapyrylium compounds, telluropyrylium compounds, aromatic aldadiene compounds, oligophenylene compounds, thioxanthene compounds, cyanine compounds, acridine compounds, metal complexes of 8-hydroxyquinoline compounds, metal complexes of 2-bipyridine compounds, complexes of a Schiff salt and a group III metal, oxine metal complexes, and rare earth complexes.

<Electron Injection Layer>

The electron injection layer 20 has a function of injecting electrons supplied from the counter electrode 21 to the second light emitting layer 19. The electron injection layer 20 is formed by doping an organic material having a high electron transport property with a dopant metal selected from an alkali metal or an alkaline earth metal. According to at least one embodiment, Ba is the dopant. Concentration of the Ba dopant is 40 wt % or less, advantageously 20 wt % or less, and according to at least one embodiment 15 wt % or less.

Alkali metals are lithium (Li), sodium (Na), potassium (K), rubidium (Rb), cesium (Cs), and francium (Fr), and metals corresponding to alkaline earth metals are calcium (Ca), strontium (Sr), barium (Ba), and radium (Ra).

As the organic material used in the electron injection layer 20, examples include π electron low molecular weight organic materials such as oxadiazole derivatives (OXD), triazole derivatives (TAZ), and phenanthroline derivatives (BCP, Bphen).

<Counter Electrode>

The counter electrode 21 is made of a light-transmissive electrically-conductive material, and is formed on the electron injection layer 20. The counter electrode 21 functions as a cathode.

As a material of the counter electrode 21, ITO or IZO can be used, for example. Alternatively, as a material of the counter electrode 21, a metal thin film may be used, such as silver, a silver alloy, aluminum, or an aluminum alloy.

<Sealing Layer>

The sealing layer 22 has a function of restricting exposure to moisture and air of organic layers such as the hole transport layers 16, the first light emitting layers 17, the connecting layer 18, the second light emitting layer 19, and the electron injection layer 20, and is made of a light-transmissive material such as silicon nitride (SiN) or silicon oxynitride (SiON). Further, a sealing resin layer made of a resin material such as acrylic resin or silicone resin may be provided on the layer made of a material such as silicon nitride (SiN) or silicon oxynitride (SiON).

According to the present embodiment, the organic EL display panel 100 is a top-emission type, and therefore the sealing layer 22 is made of a light-transmissive material.

2. Aperture Ratio of Structure of Banks and Light Emitting Layers

Figure 3A:
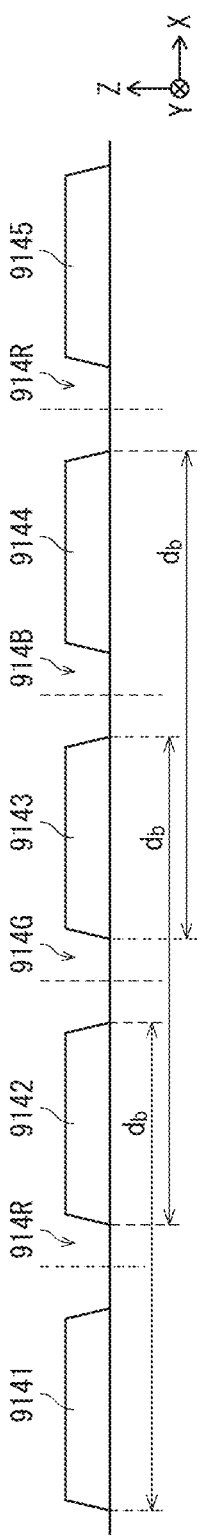
FIG. 3A, FIG. 3B, FIG. 3C, FIG. 3D, and FIG. 3E are diagrams illustrating bank arrangements of organic EL display panels that have the same definition, according to at least one embodiment and comparative examples.
Figure 3B:
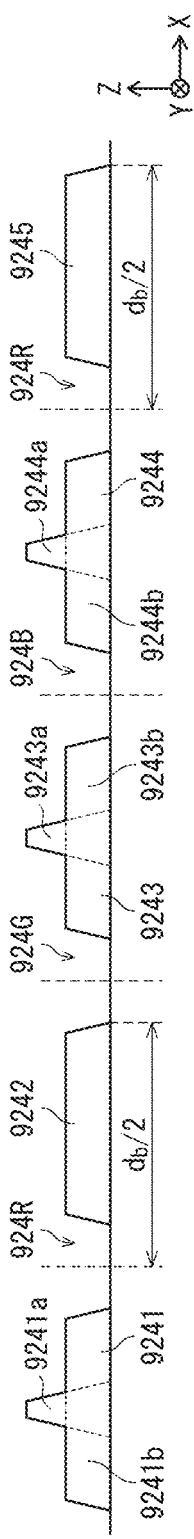
Figure 3C:
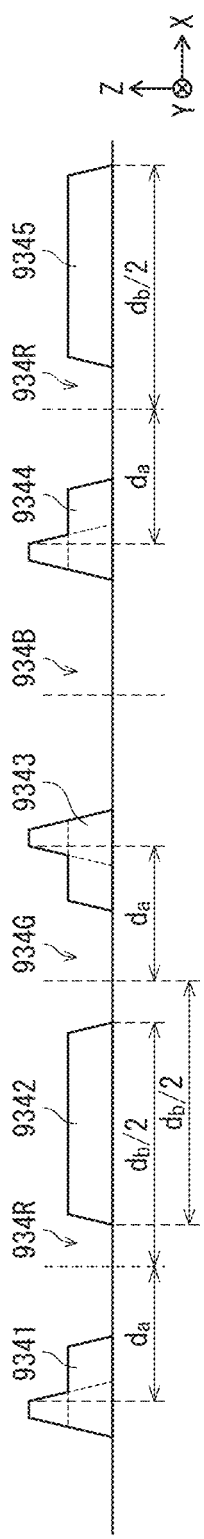
Figure 3D:
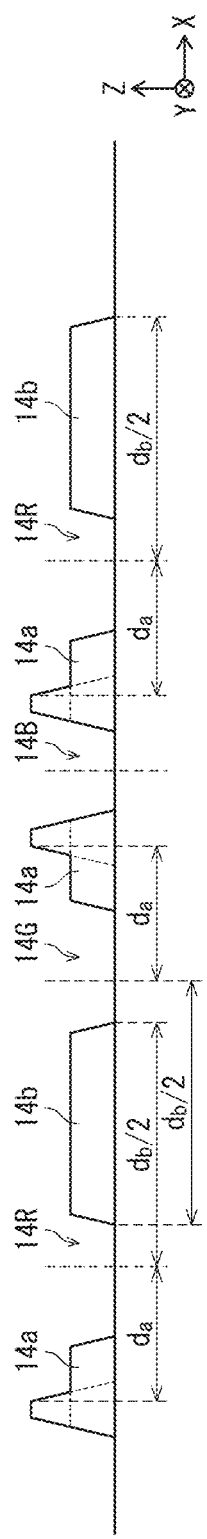
Figure 3E:
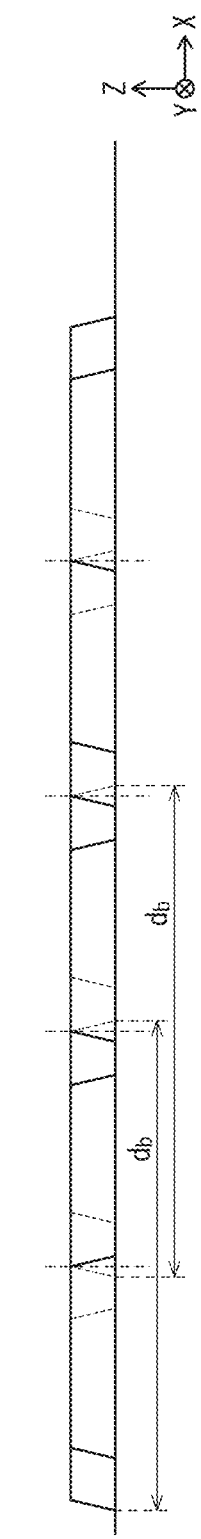

FIG. 3A, FIG. 3B, FIG. 3C, FIG. 3D, and FIG. 3E are diagrams illustrating bank structure pertaining to at least one embodiment and comparative examples. FIG. 3A, FIG. 3B, FIG. 3C. FIG. 3D, and FIG. 3E are cross section diagrams taken along the xz plane, and are simplified to only show the substrate 11 and banks.

FIG. 3A illustrates Comparative Example 1, illustrating a conventional bank structure in which red light emitting layers, green light emitting layers, and blue light emitting layers are all formed by using an application method. As described above, in order to prevent ink applied to an aperture 914R from overflowing into aperture 914B and aperture 914G, the bank edge distance $d_b$ must satisfy Expression (1). Accordingly, a left edge of bank 9141 and a right edge of bank 9142 are each separated from a center of aperture 914R by a distance $d_b/2$. Similarly, a left edge of the bank 9142 and a right edge of bank 9143 are each separated from a center of aperture 914G by a distance $d_b/2$.

FIG. 3B illustrates Comparative Example 2, illustrating a structure in which upper portions 9241a, 9243a, 9244a are provided on banks 9241, 9243, 9244 adjacent to a blue light emitting layer, in order to form the blue light emitting layer by a vapor deposition method. According to Comparative Example 2, the upper portion 9241a is provided at a height such that ink for forming the red light emitting layer does not overflow from the aperture 924R towards the blue light emitting layer. Similarly, the upper portion 9243a is provided at a height such that ink for forming the green light emitting layer does not overflow from the aperture 924G towards the blue light emitting layer.

FIG. 3C is a diagram illustrating Comparative Example 3, in which the bank structure has the same effect as the bank structure of Comparative Example 2, but aperture ratio is improved. According to Comparative Example 2, ink does not flow into the aperture 924B in which the blue light emitting layer is formed, due to provision of the upper portions 9241a, 9243a, 9244a. Thus, an upper portion left edge of the bank 9241 does not need to be separated by a distance $d_b/2$ from the center of the aperture 924R. That is, a left-side-portion 9241b of the bank 9241, left of the upper portion 9241a, need not exist. Similarly, an upper portion right edge of the bank 9243 does not need to be separated by a distance $d_b/2$ from the center of the aperture 924G and a right-side-portion 9243b of the bank 9243, right of the upper portion 9243a, need not exist. Similarly, an upper portion left edge of the bank 9244 does not need to be separated by a distance $d_b/2$ from the center of the aperture 924R, and a left-side-portion 9244b of the bank 9244, right of the upper portion 9244a, need not exist. Accordingly, as illustrated by Comparative Example 3, a distance between the upper portion right edge of the bank 9341 and the center of the aperture 934R, a distance between the upper portion left edge of the bank 9343 and the center of the aperture 934G, and a distance between the upper portion right edge of the bank 9344 may each equal $d_a$, which is smaller than $d_b/2$. The effect of preventing color mixing in the aperture 934B in which the blue light emitting layer is formed is not lost in this structure, and aperture ratio can be improved by increasing the width of the aperture 934B. Further, because positions of the banks 9341, 9343, 9344, which have upper portions, are closer to the aperture 934B in which the blue light emitting layer is formed, width of the apertures 934R, 934G in which the red light emitting layer and the green light emitting layer are formed can be increased.

FIG. 3D is a diagram illustrating a bank structure embodiment. According to this embodiment, width of an aperture 14B is smaller than width of apertures 14R, 14G, making distances between apertures of the same color smaller in order to improve definition. The blue light emitting layer formed in the aperture 14B is formed by vapor deposition, and therefore film thickness is more uniform than that of the red light emitting layer and the green light emitting layer, which are formed by an application method. Thus, it becomes possible to make a ratio of width of a light emitting portion to width of aperture for the apertures 14B greater than a ratio of width of a light emitting portion to width of aperture for the apertures 14R, 14G. Accordingly, even when width of the apertures 14B is smaller than width of the apertures 14R, 14G, an amount of light from the blue light emitting layer is not insufficient. Thus, according to this embodiment, even when compared to Comparative Example 1, a reduction in aperture ratio is avoided while improving definition.

Here, upper portions of the banks 14a provided so that ink for forming the red light emitting layer does not overflow from the apertures 14R to the left (to the blue light emitting layer) are described. An edge of the bank 14a adjacent to the aperture 14R is a distance $d_{ar}$ from an application center in the aperture 14R. The distance $d_{ar}$ is a value at least equal to a radius $r_r$ of ink ejected from a nozzle for forming the red light emitting layer plus the maximum deviation d between the application position set for the inkjet head 4030 and an actual application position. Thus, ink for forming the red light emitting layer, upon landing, does not overflow the edge of the upper portion of the bank 14a on the side of the aperture 14R, and does not reach the aperture for forming the blue light emitting layer. The following describes height of the upper portions of the banks 14a. Ink that has landed spreads to the radius $R_r$ as described above if on a level plane, but since the upper portions of the banks 14a are present, the ink does not spread to the left (blue light emitting layer side). If a radius of a red ink drop dropped from a nozzle is $r_r$, the volume of the ink drop is $4/3\pi r_r^3$, but after the ink lands, assuming that spreading is restricted and the ink fits into a cylinder of radius $r_r$ after landing, height of the cylinder becomes $4/3\pi r_r$. That is, by making height of the upper portions of the banks 14a taller than $4/3\pi r_r$, ink for forming the red light emitting layer will not overflow from the aperture 14R to the left (blue light emitting layer side).

Similarly, an edge of the bank 14a adjacent to the aperture 14G provided so that ink for forming the green light emitting layer does not overflow to the right (blue light emitting layer side) from the aperture 14G, is a distance $d_{ag}$ from an application center in the aperture 14G. If a radius of a green ink drop dropped from a nozzle is $r_r$, the distance $d_{ag}$ is a value at least equal to a radius $r_g$ of ink ejected from a nozzle for forming the green light emitting layer plus the maximum deviation d between the application position set for the inkjet head 4030 and an actual application position. Height of the upper portion of the bank 14a is greater than $4/3\pi r_g$.

In the above description of height of the upper portions of the banks 14a, the influences of ink viscosity, distance to bank, friction, and the like have been ignored, but in practice, in order that ink does not overflow into the blue light emitting layer, these influences are considered to allow for a lower height.

The following describes maintaining the bank structure of Comparative Example 1 while improving definition. In order to improve definition, distances between apertures of the same color must be decreased, and therefore in practice the distance between the center of the aperture 914R and the center of the aperture 914G must be decreased. When either of distance between the right edge of the bank 9142 and the center of the aperture 914R and distance between the left edge of the bank 9142 and the center of the aperture 914G are made smaller than $d_b/2$, the risk of mixed colors increases due to mixing of ink for forming the red light emitting layer and ink for forming the green light emitting layer. Accordingly, if an attempt is made to improve definition while preventing color mixing, the distance between the left edge of the bank 9142 and the center of the aperture 914R and the distance between the right edge of the bank 9142 and the center of the aperture 914G must be decreased, decreasing widths of the aperture 914R and the aperture 914G, or in other words, a reduction in aperture ratio is inevitable. When a designed definition exceeds a threshold, as illustrated in FIG. 3E (Comparative Example 4), a design width of apertures becomes zero or less, that is, implementation becomes impossible.

As described above, according to at least one embodiment, aperture ratio can be improved over methods of forming all light emitting layers by application methods, even when limitations of an inkjet device remain the same. Accordingly, both definition can be improved and aperture ratio can be improved even with a combination of inkjet device and organic EL display device definition that would ordinarily result in a trade-off between organic EL display device definition and aperture ratio.

In order that the bank edge distance $d_b$ can be set small in a case in which all light emitting layers are forming by an application method (in the case of Comparative Example 1), provision of protrusions similar to the upper portions 141 of the banks 14a can also be considered. However, in this case (Comparative Example 3), if the distance between a protrusion of a bank on the right side of an aperture and a protrusion of a bank on the left side of the aperture is not at least $d_b'$, color mixing cannot be prevented. Accordingly, a distance $P_p$ between application center points of adjacent subpixels must satisfy the following expression.

$$P_p \geq d_b' = 2(d+r) \qquad \text{Expression (5)}$$

On the other hand, in order to make the aperture ratio higher in Comparative Example 3 than in Comparative Example 2, a lower limit of the distance $P_p$ between application center points of adjacent subpixels according to Expression (5) must be lower than a lower limit according to Expression (3). Accordingly, unless the following expression is satisfied, adopting the structure of Comparative Example 3 is meaningless.

$$2(d+r) < 2(d+R) - W_b$$

$$R - r > W_b/2 \qquad \text{Expression (6)}$$

That is, if the difference between ink drop radius r and wet spread radius R after landing is equal to or less than half of bank width, the aperture ratio is also improved by Comparative Example 3. However, in practice, the difference between ink drop radius r and wet spread radius R after landing is approximately 1 μm, whereas bank width is 5 μm or more, and therefore when the structure of Comparative Example 3 is adopted, aperture ratio is actually lower than that of Comparative Example 1.

<<Aperture Ratio Examples>>

For example, when generating a panel having 423 pixels per inch (ppi), a width of one pixel is set as 60 μm. With respect to this, the maximum deviation d of the inkjet device is assumed to be 6 μm, and a spreading range D is assumed to be 6.5 μm. In this example, a minimum value for the bank edge distance $d_b$ becomes 23 μm. Accordingly, in a conventional bank structure, the situation of Comparative Example 4 is caused, and apertures cannot be provided.

In contrast, according to the structure of the embodiment, when the bank width between the apertures 14R, 14G is 12 μm and the bank width on either side of the aperture 14B is 6 μm, width of the apertures 14R, 14G can be 13 μm and width of the aperture 14B can be 10 μm. Although aperture ratio is not defined by only width, an aperture ratio of approximately 30% can be ensured.

3. Method for Manufacturing Organic EL Display Panel

A method for manufacturing the organic EL display panel 100 is described with reference to the drawings. FIG. 4A to FIG. 8B are schematic cross section diagrams illustrating states in the manufacture of the organic EL display panel 100. FIG. 9 is a flowchart illustrating the method for manufacturing the organic EL display panel 100.

(1) Forming Substrate 11

Figure 4A:
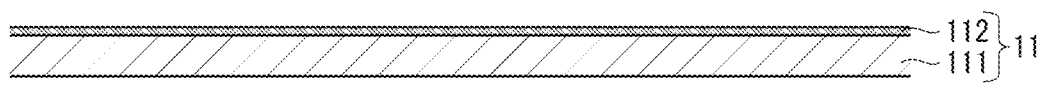
FIG. 4A, FIG. 4B, FIG. 4C, and FIG. 4D are cross section diagrams schematically illustrating portions of a process of manufacturing an organic EL display panel pertaining to at least one embodiment.

First, as illustrated in FIG. 4A, the TFT layer 112 is formed on the base 111 to form the substrate 11 (step S1 in FIG. 9). The TFT layer 112 can be formed by a known TFT manufacturing method.

Figure 4B:
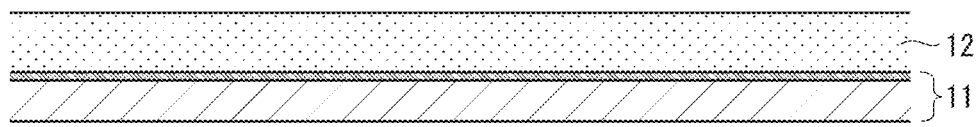

Next, as illustrated in FIG. 4B, the interlayer insulating layer 12 is formed on the substrate 11 (step S2 in FIG. 9). The interlayer insulating layer 12 can be formed by lamination using, for example, plasma chemical vapor deposition (CVD), sputtering, or the like.

Next, dry etching is performed in the interlayer insulating layer 12 in locations above source electrodes in the TFT layer, forming contact holes. The contact holes are formed so that bottoms of the contacts holes each expose a surface of a source electrode.

Next, a connecting electrode layer is formed following inner walls of the contact holes. An upper portion of the connecting electrode layer is disposed above the interlayer insulating layer 12. Forming the connecting electrode layer can be achieved by using a sputtering method, for example, and after a metal film is formed, patterning by using a photolithography method and a wet etching method.

(2) Forming Pixel Electrodes 13

Figure 4C:
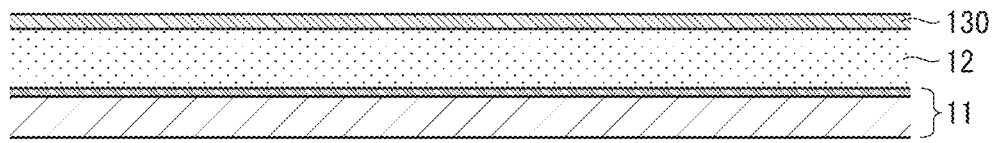

Next, as illustrated in FIG. 4C, a pixel electrode material layer 130 is formed on the interlayer insulating layer 12 (step S3 in FIG. 9). The pixel electrode material layer 130 can be formed by using, for example, a vacuum deposition method, a sputtering method, or the like.

Figure 4D:
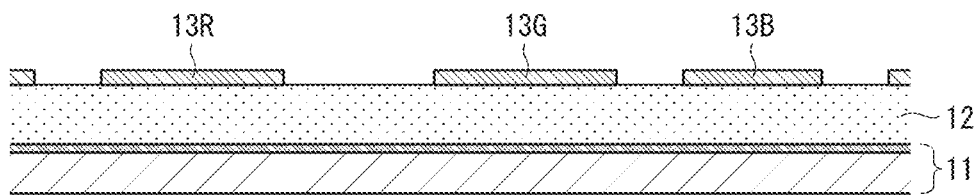

Next, as illustrated in FIG. 4D, the pixel electrode material layer 130 is patterned by etching, forming the pixel electrodes 13R, 13G, 13G, one for each subpixel (step S4 in FIG. 9).

(3) Forming Banks 14

Next, the third banks then the banks 14 are formed. A third bank material layer is formed by applying a bank material resin, which is a material of the third banks, onto the pixel electrodes 13R, 13G, 13B, and the interlayer insulating layer 12. Then, by performing pattern exposure and developing on the third bank material layer, the third banks are formed.

Figure 5A:
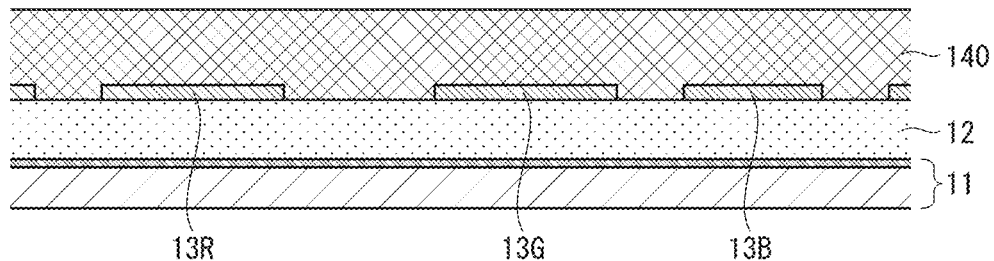
FIG. 5A, FIG. 5B, FIG. 5C, and FIG. 5D are cross section diagrams schematically illustrating portions of the process of manufacturing an organic EL display panel pertaining to at least one embodiment.
Figure 5B:
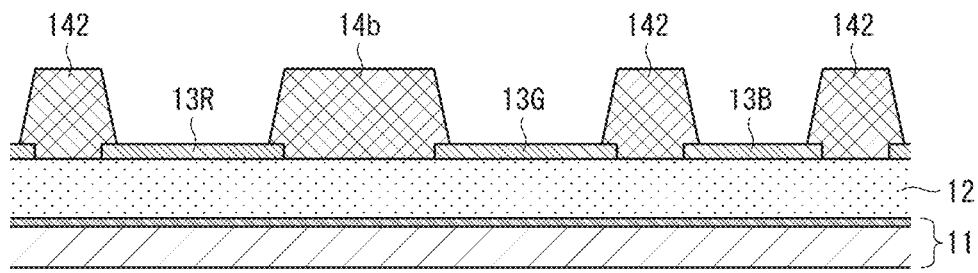
Figure 5C:
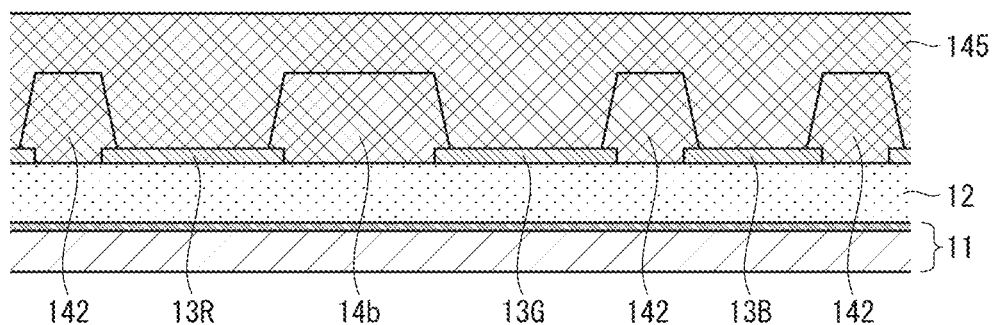
Figure 5D:
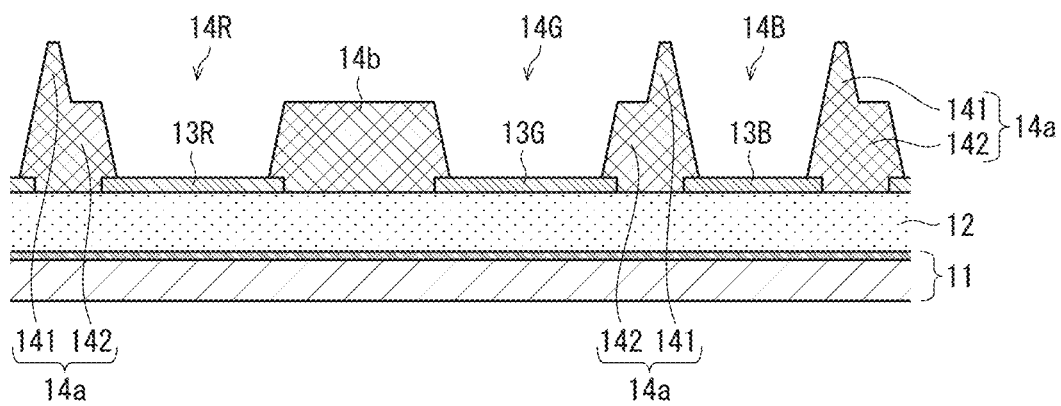

Next, as illustrated in FIG. 5A, a first bank material layer 140 is formed by applying a bank material resin, which is a material of the banks 14, onto the pixel electrodes 13R, 13G, 13B, the interlayer insulating layer 12, and the third banks. The first bank material layer 140 is formed by uniformly applying a solution of phenol resin in a solvent (for example, a mixed solvent of ethyl lactate and gamma-Butyrolactone (GBL)) onto the pixel electrodes 13R, 13G, 13B, the interlayer insulating layer 12, and the third banks by using a spin coating method or the like. Then, by pattern exposure and developing of the first bank material layer 140, the banks 14b and the lower portions 142 of the banks 14a are formed (FIG. 5B). Next, a second bank material layer 145 is formed by applying a bank layer resin onto the pixel electrodes 13R, 13G 13B, the interlayer insulating layer 12, the banks 14b, the lower portions 142 of the banks 14a, and the third banks (FIG. 5C). Note that material of the second bank material layer 145 may be the same as the material of the first bank material layer 140. Then, by performing pattern exposure and developing on the second bank material layer 145, the upper portions 141 of the banks 14a are formed on the lower portions 142 of the banks 14a (step S5 in FIG. 9, FIG. 5D). Finally, the banks 14 are baked (step S7 in FIG. 9). Thus, apertures in which the light emitting layers 17 are formed are defined. Baking of the banks 14 is performed at a temperature from 150° C. to 210° C. for 60 minutes, for example.

Further, in forming the banks 14, surfaces of the banks 14 may be further subjected to a surface treatment with a defined alkaline solution, water, an organic solvent, or the like, and may be subjected to a plasma treatment. Such treatments are performed for a purpose of adjusting a contact angle of ink (solution) applied to the apertures with respect to the banks 14, or for a purpose of imparting water repellency to the surfaces.

Methods of forming the banks 14a are not limited to the examples given above. For example, the banks 14a. 14b may be formed by patterning a bank material layer by using a halftone mask. Further, by using materials having different exposure wavelengths for the second bank material layer and the first bank material layer, patterning may be performed in the following order: forming the first bank material layer, forming the second bank material layer, exposing and developing the second bank material layer, and exposing and developing the first bank material layer. Further, the upper portions 141 and a portion of the lower portions 142 directly below the upper portions 141 of the banks 14a may be formed by patterning of the first bank material layer, and the banks 14b and the remaining portions of the lower portions 142 of the banks 14a may be formed by patterning of the second bank material layer.

(4) Forming Hole Injection Layers 15

Figure 6A:
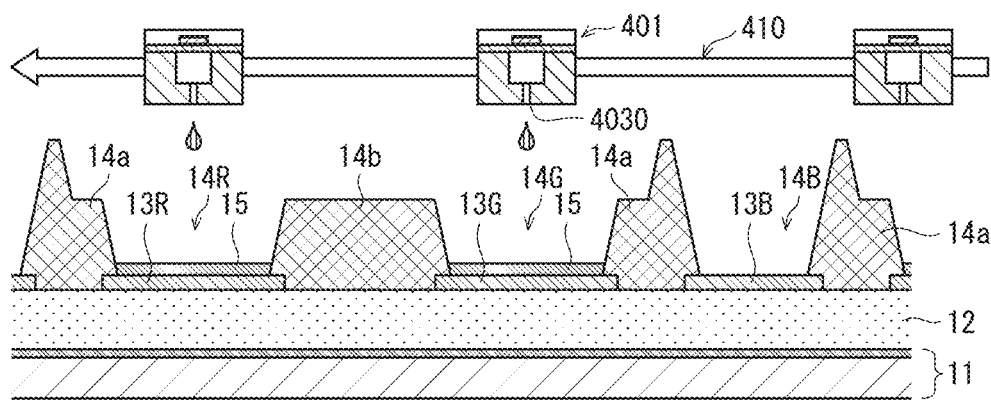
FIG. 6A, FIG. 6B, FIG. 6C, and FIG. 6D are cross section diagrams schematically illustrating portions of the process of manufacturing an organic EL display panel pertaining to at least one embodiment.

Next, as illustrated in FIG. 6A, the hole injection layers 15 are formed by scanning an inkjet head 401 along a direction 410 orthogonal to the banks 14a, 14b while ejecting ink including material of the hole injection layers 15 from a nozzle 4030 above the apertures 14R, 14G, in order to apply the ink onto the pixel electrodes 13R, 13G in the apertures 14R, 14G, then performing baking (drying) (step S7 in FIG. 9). Applied ink does not overflow the banks 14a, and therefore the ink including material of the hole injection layers 15 does not flow into the apertures 14B. In other words, the pixel electrodes 13B in the apertures 14B remain exposed.

(5) Forming Hole Transport Layers 16

Figure 6B:
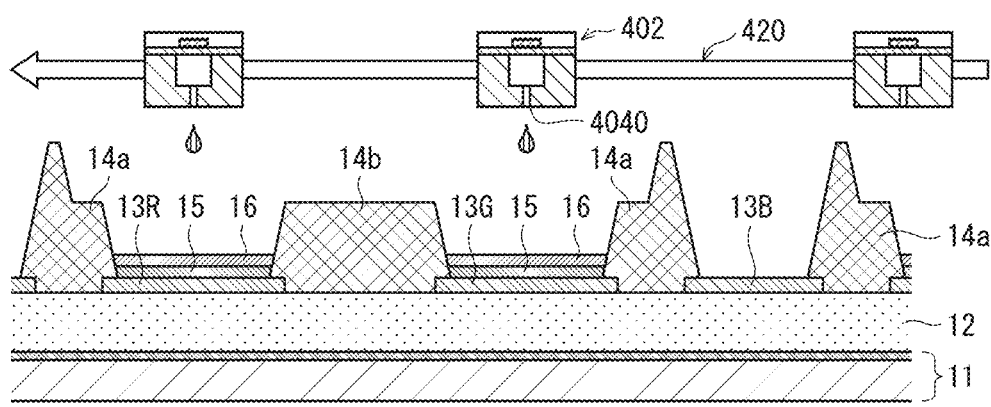

Next, as illustrated in FIG. 6B, the hole transport layers 16 are formed by scanning an inkjet head 402 along a direction 420 orthogonal to the banks 14a, 14b while ejecting ink including material of the hole transport layers 16 from a nozzle 4040 above the apertures 14R, 14G, in order to apply the ink onto the hole injection layers 15 in the apertures 14R, 14G, then performing baking (drying) (step S8 in FIG. 9). Applied ink does not overflow the banks 14a, and therefore the ink including material of the hole transport layers 16 does not flow into the apertures 14B. In other words, the pixel electrodes 13B in the apertures 14B remain exposed.

(6) Forming First Light Emitting Layers 17

Figure 6C:
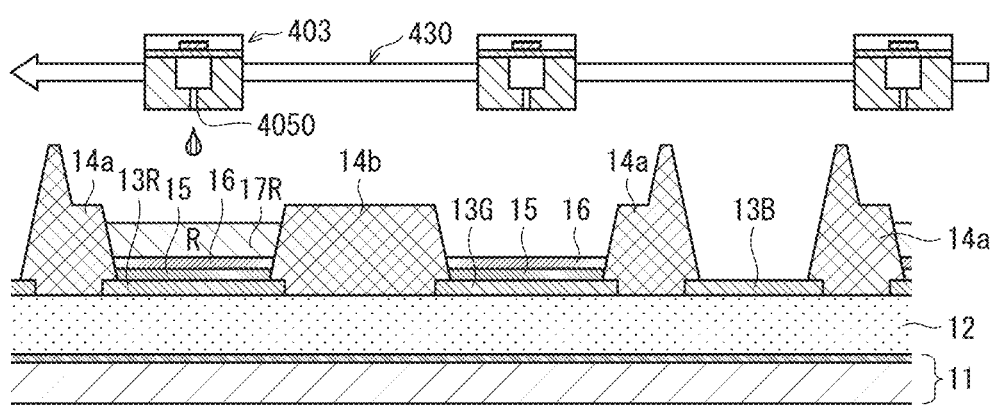
Figure 6D:
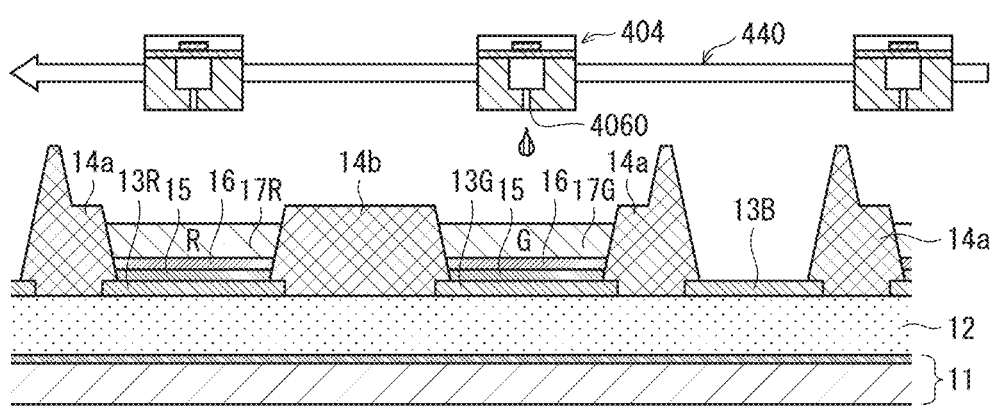

Next, the first light emitting layers 17R, 17G are formed on the hole transport layers 16 in the apertures 14R, 14G (step S9 in FIG. 9). Next, as illustrated in FIG. 6C, the first light emitting layers 17R are formed by scanning an inkjet head 403 in a direction 430 orthogonal to the banks 14a, 14b while ejecting ink including organic light emitting material from a nozzle 4050 above the apertures 14R, in order to apply the ink onto the hole transport layers 16 in the apertures 14R, then performing drying. Next, as illustrated in FIG. 6D, the first light emitting layers 17G are formed by scanning an inkjet head 404 in a direction 440 orthogonal to the banks 14a, 14b while ejecting ink including organic light emitting material from a nozzle 4060 above the apertures 14G, in order to apply the ink onto the hole transport layers 16 in the apertures 14G then performing drying. Subsequently, baking is performed to dry the ink, forming the first light emitting layers 17R. 17G. Applied ink does not overflow the banks 14a, and therefore the ink including material of the first light emitting layers 17R, 17G does not flow into the apertures 14B. In other words, the pixel electrodes 13B in the apertures 14B remain exposed.

Further, according to the description above, the inkjet head 403 ejecting the ink including the material of the first light emitting layers 17R and the inkjet head 404 ejecting the ink including the material of the first light emitting layers 17G scan independently, but the inkjet head 403 and the inkjet head 404 may scan at the same time, thereby performing application of the first light emitting layers 17R and the first light emitting layers 17G at the same time.

(7) Forming Connecting Layer 18

Figure 7A:
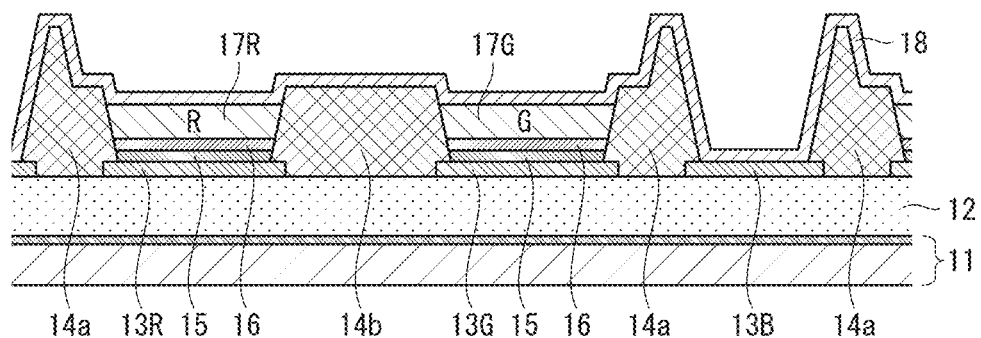
FIG. 7A, FIG. 7B, and FIG. 7C are cross section diagrams schematically illustrating portions of the process of manufacturing an organic EL display panel pertaining to at least one embodiment.

Next, as illustrated in FIG. 7A, the connecting layer 18 is formed on the first light emitting layers 17R, 17G, the pixel electrodes 13B, and the banks 14a, 14b (step S10 in FIG. 9). The connecting layer 18 is formed, for example, by forming a film common to all subpixels by using a vapor deposition method with respect to an organic material that is a phosphorescent host material.

(8) Forming Second Light Emitting Layer 19

Figure 7B:
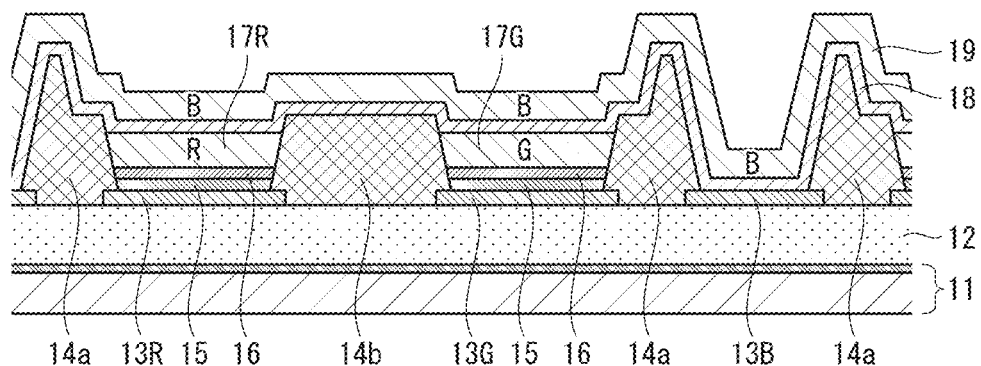

Next, as illustrated in FIG. 7B, the second light emitting layer 19 is formed on the connecting layer 18 (step S11 in FIG. 9). The second light emitting layer 19 is formed, for example, by forming a film common to all subpixels by using a vapor deposition method with respect to a material of the second light emitting layer 19.

(9) Forming Electron Injection Layer 20

Figure 7C:
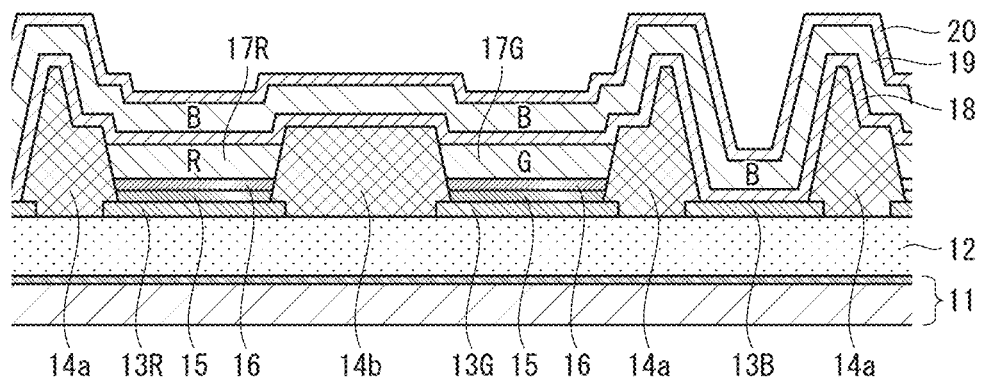

Next, as illustrated in FIG. 7C, the electron injection layer 20 is formed on the second light emitting layer 19 (step S12 in FIG. 9). The electron injection layer 20 is formed, for example, by forming a film common to all subpixels by using a co-evaporation deposition method with respect to an electron-transporting organic material and metal dopant.

(10) Forming Counter Electrode 21

Figure 8A:
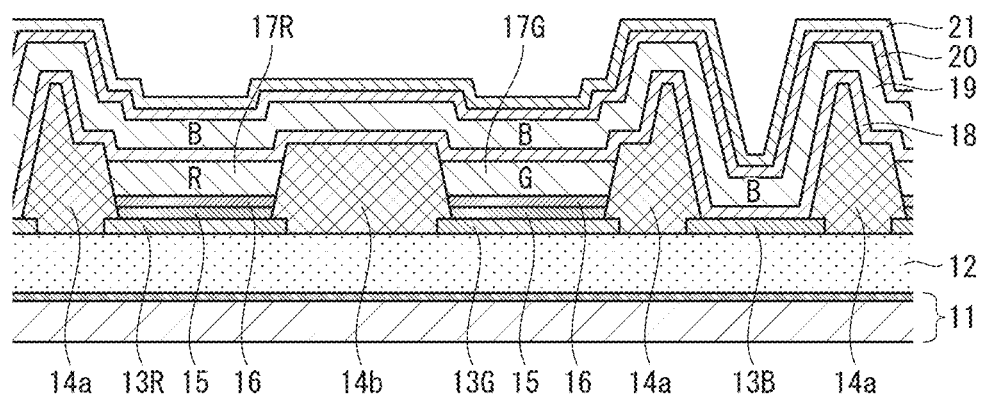
FIG. 8A and FIG. 8B are cross section diagrams schematically illustrating portions of the process of manufacturing an organic EL display panel pertaining to at least one embodiment.
Figure 9:
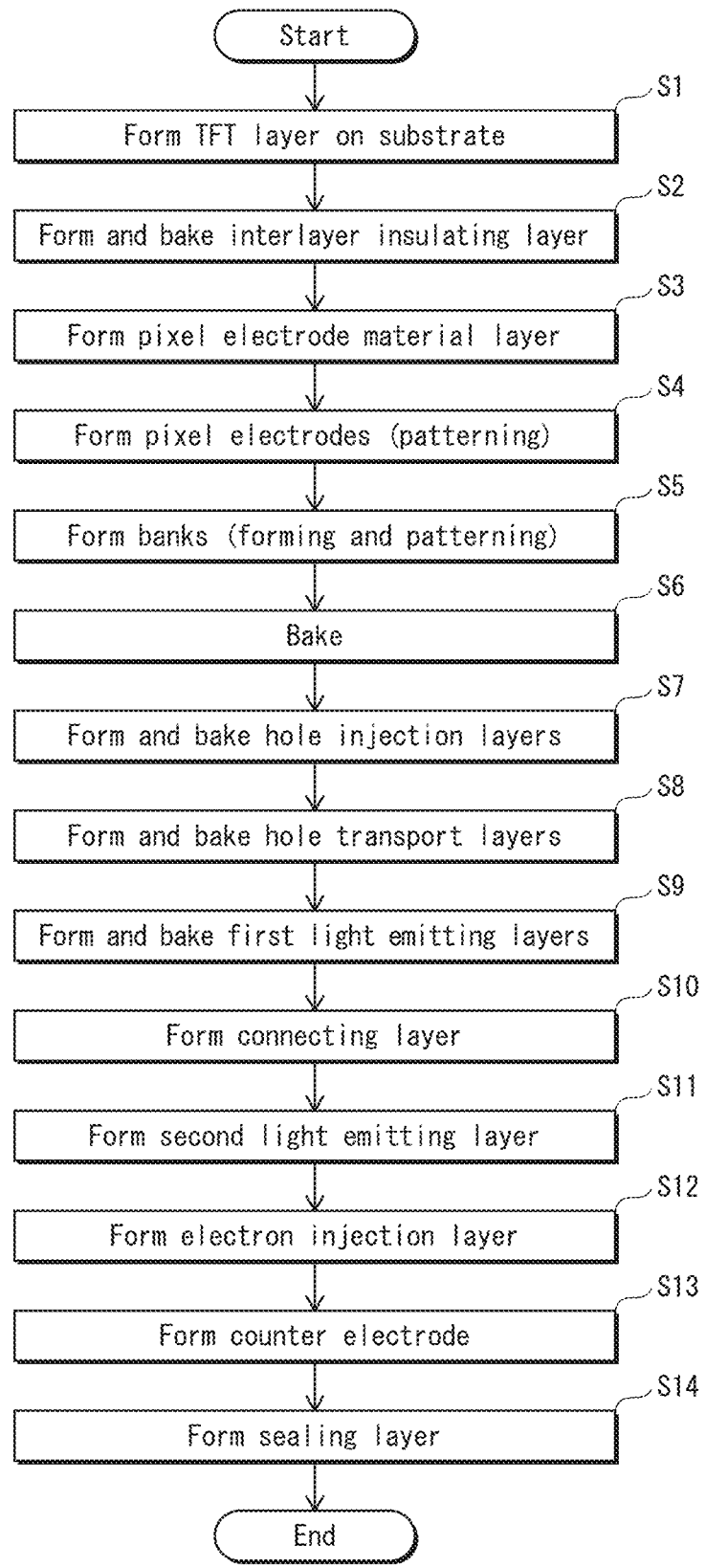
FIG. 9 is a flowchart illustrating a process of manufacturing an organic EL display panel pertaining to at least one embodiment.

Next, as illustrated in FIG. 8A, the counter electrode 21 is formed on the electron injection layer 20 (step S13 in FIG. 9). The counter electrode 21 is a film formed by using a sputtering method or a vacuum deposition method on ITO. IZO, silver, aluminum, or the like.

(11) Forming Sealing Layer 22

Figure 8B:
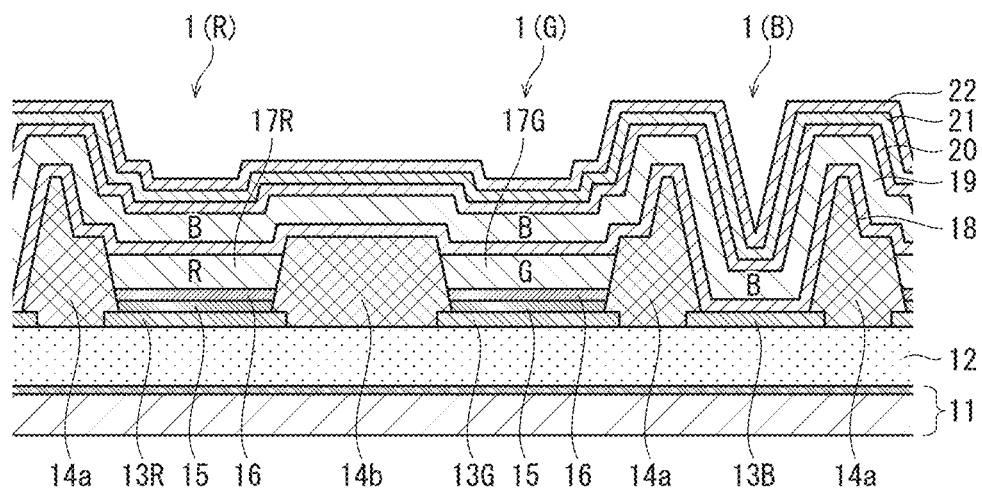

Next, as illustrated in FIG. 8B, the sealing layer 22 is formed on the counter electrode 21 (step S13 in FIG. 9). The sealing layer 22 can be formed as a film by using a sputtering method or CVD method on SiON, SiN, or the like.

Color filters and/or an upper substrate may be disposed on and bonded to the sealing layer 22.

4. Modifications (1) According to at least one embodiment, the hole injection layers 15, the hole transport layers 16, and the electron injection layer 20 are included, but the disclosed structure is not limited to this. For example, instead of the hole injection layers 15 and the hole transport layers 16, single phase hole injection/transport layers may be used. Further, the organic EL display panel may include structural elements other than described above. For example, an intermediate layer made of an electron transport layer or alkali metal may be disposed between the second light emitting layer 19 and the electron injection layer 20.

Further, a structure in which a functional layer is not present between the pixel electrodes 13B and the connecting layer 18 in the organic EL elements 1(B) is described, but a functional layer formed by a vapor deposition method or sputtering may be present between the pixel electrodes 13B and the connecting layer 18, as long as a functional layer formed by an application method is not present. For example, between the pixel electrodes 13B and the connecting layer 18, a hole injection layer made of a transition metal oxide (for example, tungsten oxide) may be present.

(2) According to at least one embodiment, the first light emitting layers 17 are red light emitting layers and green light emitting layers, and the second light emitting layer 19 is a blue light emitting layer, but the present disclosure is not limited to this. For example, the organic EL display panel may include four or more colors of subpixel, for example a yellow light emitting layer may be included as a further first light emitting layer formed by an application method. However, when the connecting layer 18 is used, as described according to at least one embodiment, the second light emitting layer 19 is advantageously the light emitting layer that emits light of the shortest wavelength among the light emitting layers.

(3) According to at least one embodiment, the second light emitting layer 19 does not emit light in the organic EL elements 1(R/G), but the present disclosure is not limited to this. For example, a carrier generation layer may be provided instead of the connection layer 18, in order that the second light emitting layer 19 also emits light in the organic EL elements 1(R/G). In this case, a color filter substrate is advantageously provided on the sealing layer 22, and a wavelength conversion member is advantageously provided to portions of the color filter corresponding to the organic EL elements 1(R/G).

(4) According to at least one embodiment, the first light emitting layers are formed by application of ink including a light emitting material, and subsequently a second light emitting layer is formed by a vapor deposition method above the first light emitting layers and above pixel electrodes in second apertures adjacent to first apertures in a row direction, but a structure may be adopted in which the second light emitting layer is formed in the first apertures and the second apertures adjacent thereto in the row direction, and subsequently the first light emitting layers are formed by applying ink including a light emitting material above the pixel electrodes in the first apertures, above the second light emitting layer. In this case, a connecting layer is formed above the second light emitting layer as a layer common to all the organic EL elements 1, and the first light emitting layers are formed above said connecting layer. Said connecting layer has a function of promoting injection of electrons from the counter electrode to the second light emitting layer in the organic EL elements 1(B), and a function of containing triplet excitons formed in the first light emitting layers in the first light emitting layers. According to this structure, the same effects can be achieved as the results described for at least one embodiment. As described under (3), above, a structure may be adopted in which a carrier generation layer is used instead of a connecting layer.

Organic light emitting panels and display devices pertaining to the present disclosure have been described based on embodiments and modifications, but the present disclosure is not limited to the embodiments and modifications described.

Although the technology pertaining to the present disclosure has been fully described by way of examples with reference to the accompanying drawings, it is to be noted that various changes and modifications will be apparent to those skilled in the art. Therefore unless such changes and modifications depart from the scope of the present disclosure, they should be construed as being included therein.

What is claimed is:

1. An organic electroluminescence (EL) display panel comprising:
   a substrate;
   pixel electrodes arranged in a matrix of rows and columns above the substrate;
   banks disposed above the substrate, each of the banks extending in a column direction between the pixel electrodes in a row direction;
   a first light emitting layer disposed above the pixel electrodes in a first gap selected from a plurality of gaps between the banks, wherein the first light emitting layer includes a light emitting material that emits red light;
   a second light emitting layer that is continuous above both the first light emitting layer and the pixel electrodes in a second gap adjacent in the row direction to the first gap, wherein the second light emitting layer includes a light emitting material that emits blue light; and
   a counter electrode disposed above the second light emitting layer, wherein
   the banks adjacent to the second gap includes a first upper end adjacent to the first light emitting layer and a second upper end facing the first upper end adjacent to the first light emitting layer, and a height of the first upper end is less than a height of the second upper end, and
   the first upper end portion has a uniform height in the column direction along an entirety of the column direction of the organic EL display panel;
   a third light emitting layer disposed above the pixel electrodes in a third gap adjacent in the row direction to the second gap, wherein the third light emitting layer includes a light emitting material that emits green light, the second light emitting layer is also continuous above the third light emitting layer, and a width of the banks adjacent to both the first gap and the third gap is greater than a width of the banks adjacent to the second gap.

2. The organic EL display panel of claim 1, wherein a height of the banks adjacent to both the first gap and the third gap is the same as a height of a portion adjacent to the first gap of the banks adjacent to the second gap.

3. The organic EL display panel of claim 1, wherein a width in the row direction of the second gap is less than a width in the row direction of the first gap.

4. The organic EL display panel of claim 1, further comprising
   a first functional layer between the first light emitting layer and the pixel electrodes in the first gap, wherein the first functional layer is not present between the second light emitting layer and the pixel electrodes in the second gap.

5. The organic EL display panel of claim 1, further comprising
   a second functional layer between the second light emitting layer and the first light emitting layer and between the second light emitting layer and the pixel electrodes in the second gap.

6. An organic electroluminescence (EL) display device comprising the organic EL display panel of claim 1.

* * * * *